(12) United States Patent
Woo et al.

(10) Patent No.: US 9,324,722 B1
(45) Date of Patent: Apr. 26, 2016

(54) UTILIZATION OF BLOCK-MASK AND CUT-MASK FOR FORMING METAL ROUTING IN AN IC DEVICE

(71) Applicant: GLOBALFOUNDRIES Inc., Grand Cayman (KY)

(72) Inventors: Youngtag Woo, San Ramon, CA (US); Lei Yuan, Cupertino, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/797,757

(22) Filed: Jul. 13, 2015

(51) Int. Cl.
| | |
|---|---|
| *H01L 21/4763* | (2006.01) |
| *H01L 27/11* | (2006.01) |
| *H01L 27/02* | (2006.01) |
| *H01L 21/768* | (2006.01) |

(52) U.S. Cl.
CPC .......... *H01L 27/11* (2013.01); *H01L 21/76829* (2013.01); *H01L 21/76877* (2013.01); *H01L 27/0207* (2013.01)

(58) Field of Classification Search
CPC ................ H01L 27/11; H01L 27/0207; H01L 21/76829; H01L 21/76877; H01L 21/3086; H01L 21/0337; H01L 21/7688
USPC .................. 438/637, 639, 671, 945, 950, 951
See application file for complete search history.

(56) References Cited

U.S. PATENT DOCUMENTS

| | | | | |
|---|---|---|---|---|
| 8,288,083 | B2* | 10/2012 | Zhang | H01L 21/02115 430/322 |
| 9,029,263 | B1* | 5/2015 | Kim | H01L 21/823437 257/E21.038 |
| 2010/0009470 | A1* | 1/2010 | Davis | B82Y 10/00 438/9 |
| 2012/0043646 | A1* | 2/2012 | Kim | H01L 21/0337 257/618 |
| 2014/0282296 | A1* | 9/2014 | Zou | H01L 29/66795 716/53 |
| 2015/0170973 | A1* | 6/2015 | Kim | H01L 21/823821 438/702 |
| 2015/0318181 | A1* | 11/2015 | Cantone | H01L 29/66795 438/702 |

* cited by examiner

*Primary Examiner* — Kevin M Picardat
(74) *Attorney, Agent, or Firm* — Ditthavong & Steiner, P.C.

(57) ABSTRACT

A method of forming metal routing in an IC device utilizing a cut mask in conjunction with a block mask is disclosed. Embodiments include forming a hard-mask layer on an upper surface of a silicon-oxide layer; forming spaced parallel mandrels on an upper surface of the hard-mask; forming spacers on opposite sides of each mandrel, removing the mandrels, forming alternating mandrel and non-mandrel spaces; forming block-mask portions over the mandrel and non-mandrel spaces; removing exposed sections of the hard-mask exposing sections of the silicon-oxide, removing the block-mask portions; forming a cut-mask with openings shorter than the block-mask portions over the upper surface of the hard-mask where the block-mask portions had been; removing the hard-mask through the cut-mask openings, removing the cut-mask; forming cavities in exposed regions of the silicon-oxide; removing the spacers and any remaining hard-mask; and forming metal lines in the cavities.

20 Claims, 8 Drawing Sheets

FIG. 1A
Background

UTILIZATION OF BLOCK-MASK AND CUT-MASK FOR FORMING METAL ROUTING IN AN IC DEVICE

TECHNICAL FIELD

The present disclosure relates to fabrication of semiconductor devices, and more specifically, to a photolithography (lithography) process (e.g., self-aligned double patterning (SADP)) process to form metal lines in a metal layer of an IC device. The present disclosure is particularly applicable to static random access memory (SRAM) bit cells for 10 nanometer (nm) and 7 nm technology nodes and beyond.

BACKGROUND

Generally, in fabrication of an IC device, lithography processes may be utilized to print/pattern cavities, trenches, and/or recessed-areas for creating various components, elements, and circuits. A lithography process includes forming a layer of light or radiation-sensitive material, such as photoresist, above a layer of material or a substrate. The radiation-sensitive material is selectively exposed to a light generated by a light source (such as a deep ultraviolet or extreme ultraviolet source) to transfer a pattern defined by a mask to the radiation-sensitive material. The exposed layer of radiation-sensitive material is developed to define a patterned mask layer. Various process operations, such as etching or ion implantation processes, may then be performed on the underlying layer of material or substrate through the patterned mask layer.

With advancements in processes utilized to manufacture IC devices as well as industry demand for more efficient and smaller sized devices, physical dimensions of the patterns that are to be formed in the devices are reduced. In some instances, a single patterning lithography process may be incompatible for defining a compact layer, such as a metal layer in a memory cell, where multiple lithography steps (e.g., SADP) may need to be utilized for creating a single target pattern in a layer of material. For example, double patterning is an exposure method that involves splitting (i.e., dividing or separating) a dense overall target circuit pattern into two separate, simplified/less-dense patterns. The simplified patterns are then printed separately on a wafer utilizing two separate masks (where one of the masks is utilized to image one of the simplified patterns, and the other mask is utilized to image the other simplified pattern). However, with reduced device and layout geometries, the sizes of masks (e.g., block-mask) utilized in the process are also reduced; however, this may result in undesired effects on patterns produced through the masks.

Figure 1A:
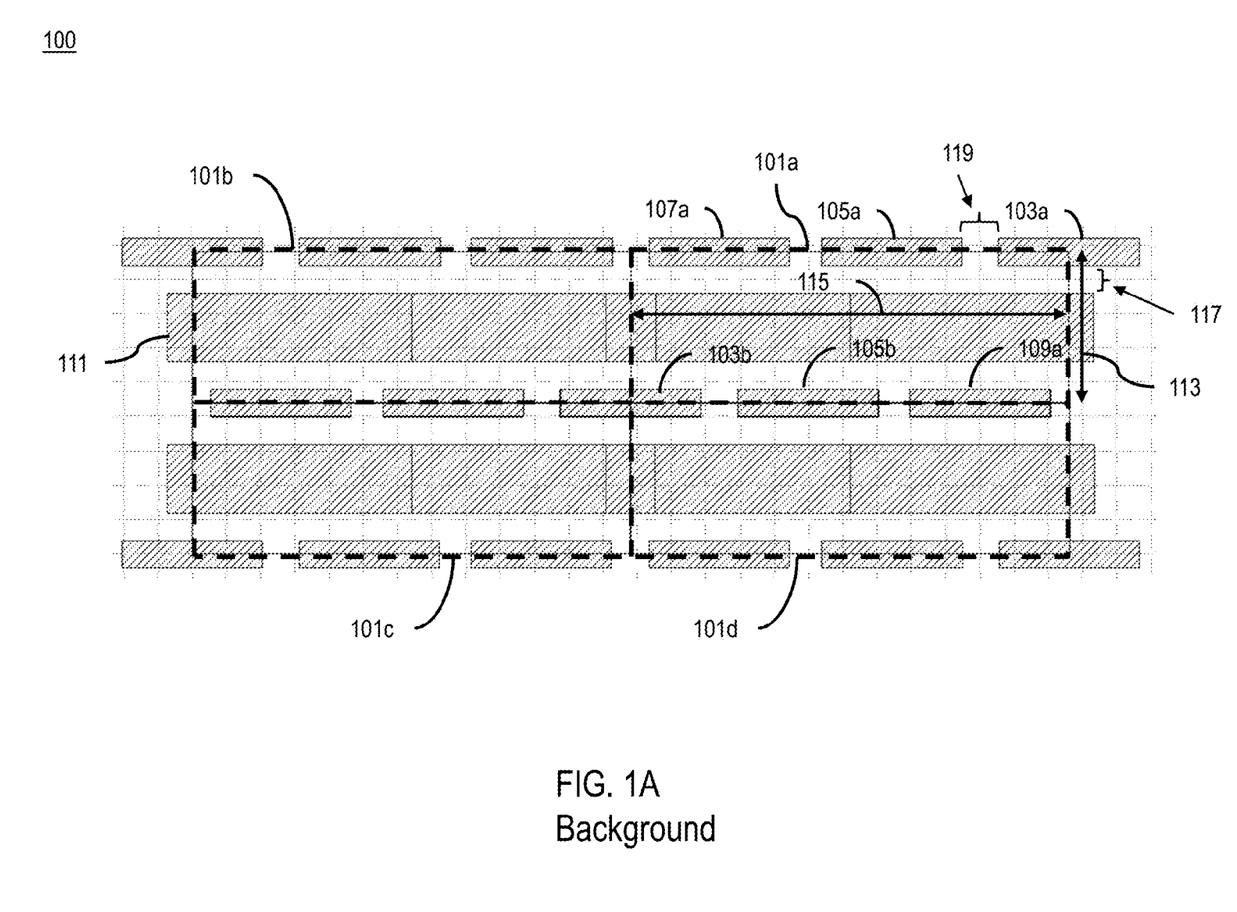
FIG. 1A schematically illustrates an example layout of a metal layer in an IC device.

FIG. 1A schematically illustrates an example layout diagram of a metal layer 100 for a SRAM cell where a 2-by-2 array of bitcells 101a, 101b, 101c, and 101d includes connectivity to various active regions. For example, the metal layer in bitcell 101a includes connectivity lines/segments 103a and 103b for a ground voltage (VSS); 105a and 105b for a positive voltage (VDD); 107a for a bitline-bar-0 (BLB0); 109a for a bitline-0 (BL0); and 111 for a wordline-2 (WL2). Geometry of a bitcell (e.g., 101a) includes contact-poly pitch (CPP) 113 and bitcell height 115 dimensions. In a SADP process utilized to pattern the layout of the metal layer 100, a side-to-side spacing 117 between two connecting parallel lines/segments, e.g., 103a and 111 or 109a and 111, may be determined by a thickness of a spacer (not shown) that was used in the process of creating the parallel lines/segments, whereas a tip-to-tip spacing 119, along the bitcell height dimension 115 may be determined by a width of a block-mask (not shown) that was also used in the process.

Figures 1B, 1C, 1D:
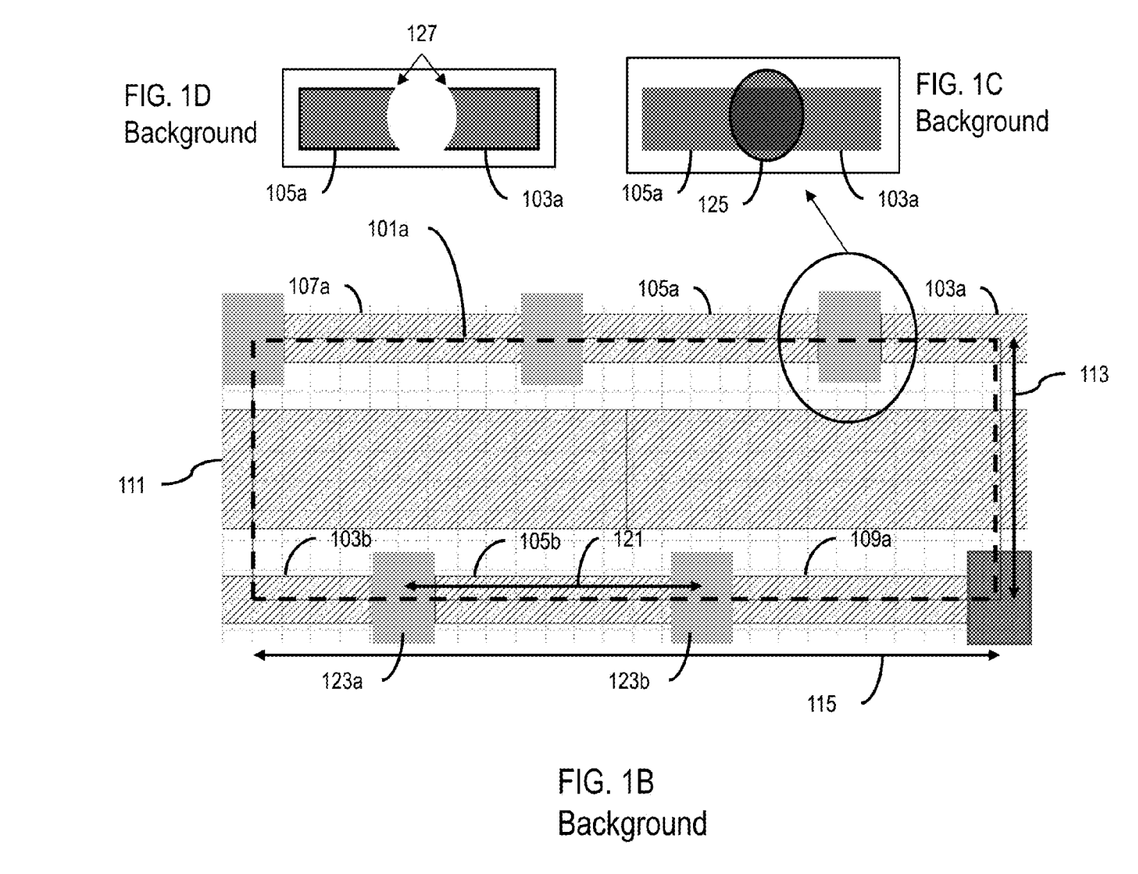
FIG. 1B schematically illustrates the size, shape, and positioning of a block mask layer is forming the layout of FIG. 1A.
FIGS. 1C and 1D schematically illustrate example block-mask and tip-edge shapes of metal lines, respectively, in a metal layer of the IC device illustrated in FIG. 1A.

As shown in FIG. 1B, a block-mask pitch 121 between adjacent block-masks; e.g., 123a and 123b, is a function of the bitcell height 115; therefore, if the bitcell height 115 in a smaller SRAM is further reduced, a double patterning process may be necessary for the block-mask layer. Additionally, as the size of a block-mask is reduced, its geometry may become similar to a contact shape 125, as shown in FIG. 1C, which may be inefficient in cutting metal segments/lines. Still, even if a cut is made, the shape (e.g., sharply curved) of the tip edges 127 of the cut metal lines (e.g., 103a and 105a), as shown in FIG. 1D, may adversely impact the electrical functionality/characteristics (e.g., electrical field) of the segments. Moreover, a smaller block-mask utilized in fabrication of an IC device may reduce fabrication process margins and adversely impact manufacturing yield, time, cost, etc. of an IC device.

A need therefore exists for methodology enabling formation of metal routing in an IC device utilizing SADP with a block-mask without double patterning the block mask.

SUMMARY

An aspect of the present disclosure is a method and process for utilizing block-mask and cut-mask, with improved geometries for better lithographic printability, in metal routing in an IC device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a hard-mask layer on an upper surface of a silicon oxide layer; forming spaced parallel mandrels on an upper surface of the hard-mask layer; forming spacers on opposite sides of each mandrel and removing the mandrels, forming alternating mandrel and non-mandrel spaces; forming block-mask portions over the mandrel and non-mandrel spaces, over the upper surface of the hard-mask layer; removing exposed sections of the hard-mask layer exposing sections of an upper surface of the silicon oxide layer, and removing the block-mask portions; forming a cut-mask with openings shorter than the block-mask portions over the upper surface of the hard-mask layer in areas where the block-mask portions had been; removing the hard-mask layer through the cut-mask openings, and removing the cut-mask; forming cavities in exposed regions of the silicon oxide layer; removing the spacers and any remaining hard-mask layer; and forming metal lines in the cavities.

In one aspect, the forming of the spacers includes conformally forming a spacer material layer over the mandrels and the upper surface of the hard-mask layer; and removing the spacer material layer from all horizontal surfaces.

In a further aspect, the block-mask portions are wider and longer than the cut-mask openings. In some aspects, a length of each block-mask portion equals a length of a metal line plus a width of a space between the metal line and an adjacent metal line on each side of the metal line.

In one aspect, a length of each cut-mask opening equals a length of a metal line. In some aspects, tip-to-tip edges of adjacent cavities in the silicon oxide layer include smooth concave and convex tip edges.

In another aspect, the metal lines include a metal layer of a SRAM device. In one aspect, metal lines formed in the mandrel spaces include word lines. One aspect includes forming adjacent block-mask portions in a tip-to-tip layout formation.

Another aspect of the present disclosure is a method including forming a hard-mask on an upper surface of a silicon oxide layer; forming a patterning template including a plurality of spaced parallel channels on an upper surface of the hard-mask, wherein the upper surface of the hard-mask is exposed between adjacent parallel channels; forming block-mask portions over and extending in a same direction as a parallel channel, over the upper surface of the hard-mask layer; removing exposed sections of the hard-mask layer exposing sections of an upper surface of the silicon oxide layer; removing the block-mask portions and the patterning template; forming a cut-mask with openings shorter than the block-mask portions over the upper surface of the hard-mask layer in areas where the block-mask portions had been; removing the hard-mask layer through the cut-mask openings, and removing the cut-mask; forming cavities in exposed regions of the silicon oxide layer; and forming metal lines in the cavities.

In some aspects, the forming of the channels includes forming spaced parallel dielectric lines on an upper surface of the hard-mask layer; and forming spacers on opposite sides of each of the dielectric lines and removing the dielectric lines, forming alternating dielectric and non-dielectric spaces. In a further aspect, metal lines formed in dielectric spaces include word lines.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of sharp metal tip shapes causing a degradation of the electric field in spaces between metal segments and a need for double exposure of a block mask layer attendant upon fabrication of compact bitcells by using compact block-masks on a metal layer. The present disclosure addresses and solves such problems, for instance, by, inter alia, utilizing a block-mask and a cut-mask to define spaces at opposite tips of metal lines in metal routing in an IC device.

Figure 2A:
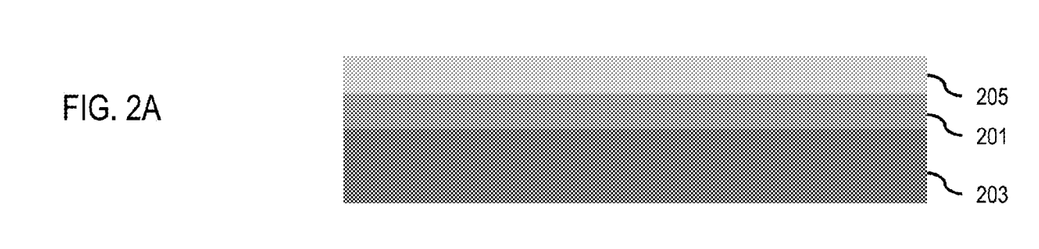
FIGS. 2A through 2J schematically illustrate cross sectional views of a process flow for using a block-mask and a cut-mask to form metal lines in a metal layer of an IC device, in accordance with exemplary embodiments.
Figure 2B:
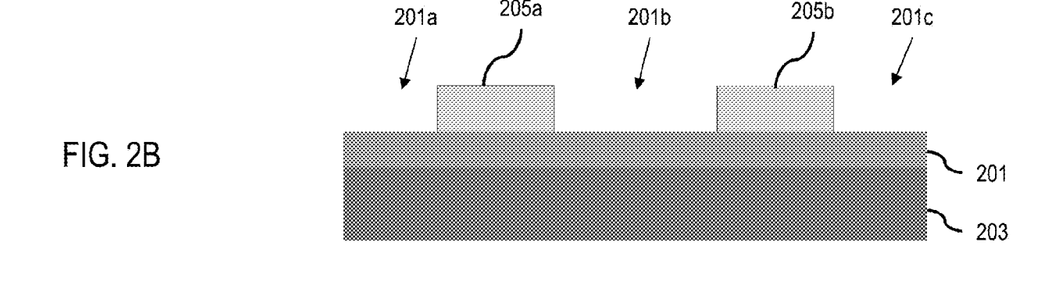

FIG. 2A illustrates a stack of different material layers to form an IC device. A hard-mask layer 201 is formed on an upper surface of a silicon oxide layer 203. The silicon oxide layer 203 may be an interlayer dielectric (ILD) formed over transistors and other circuit elements of an IC device. A material of the hard-mask layer 201 may include titanium nitride, silicon nitride, or the like. Additionally, a mandrel layer 205 may be formed on an upper surface of the hard-mask layer 201 where the mandrel layer 205 may be a layer of a dielectric material. The mandrel layer 205 may be utilized to create sacrificial patterns that can be used to form other patterns in the process flow. For instance, a mandrel mask/patterning template may be used to remove sections of the mandrel/dielectric layer 205 to form spaced parallel mandrels or dielectric lines 205a and 205b, as shown in FIG. 2B, on the upper surface of the hard-mask layer 201, wherein sections of the hard-mask layer 201 in spaces 201a, 201b, and 201c are exposed between the adjacent mandrels 205a and 205b.

Figure 2C:
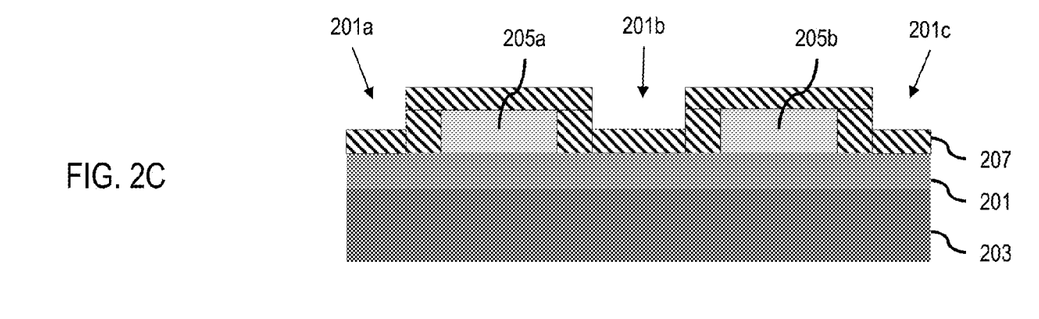
Figure 2D:
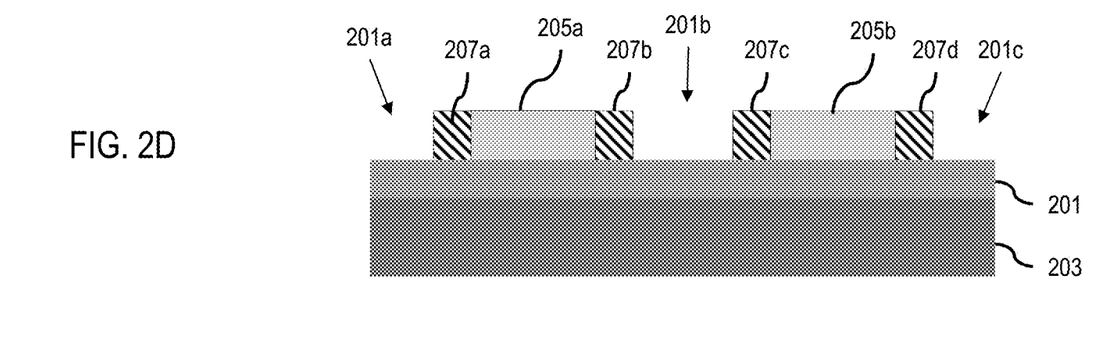
Figure 2E:
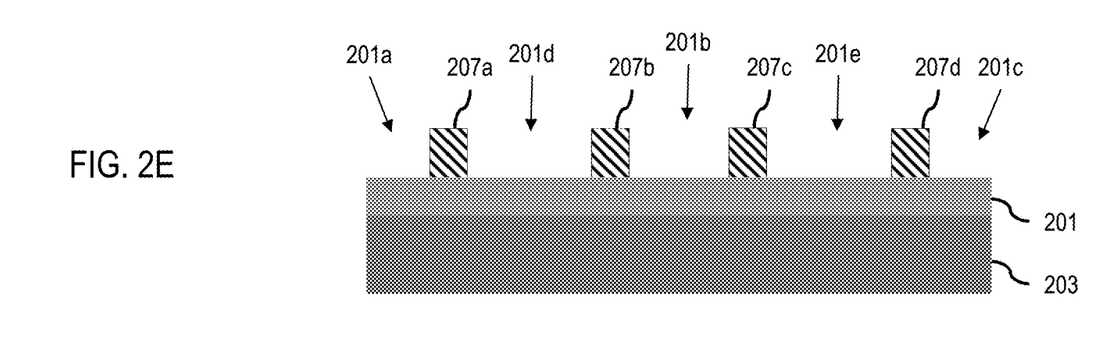

FIG. 2C illustrates deposition of a layer of spacer material 207 (e.g., silicon dioxide) over the mandrels 205a and 205b, and on the upper surface of the exposed hard-mask layer 201 in spaces 201a, 201b, and 201c. In FIG. 2D, portions of the spacer layer 207 are removed (e.g., by a dry etch process) from all horizontal surfaces such as the upper surfaces of the mandrels 205a and 205b as well as from the upper surface of the hard-mask layer 201 in spaces 201a, 201b, and 201c. Remaining sections of the spacer material 207 can provide spacers 207a, 207b, 207c, and 207d, where spacers 207a and 207b are formed on opposite sides of the mandrel 205a, and spacers 207c and 207d are formed on opposite sides of the mandrel 205b. As illustrated in FIG. 2E, by removing the mandrels 205a and 205b, additional sections of the hard-mask layer 201 in spaces 201d and 201e are exposed, which create alternating mandrel (201d and 201e) and non-mandrel (201a, 201b, and 201c) spaces on the upper surface of the hard-mask layer 201.

Figure 2F:
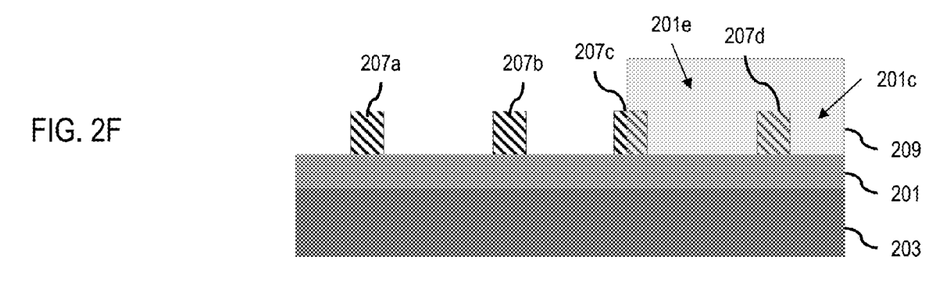
Figure 2G:
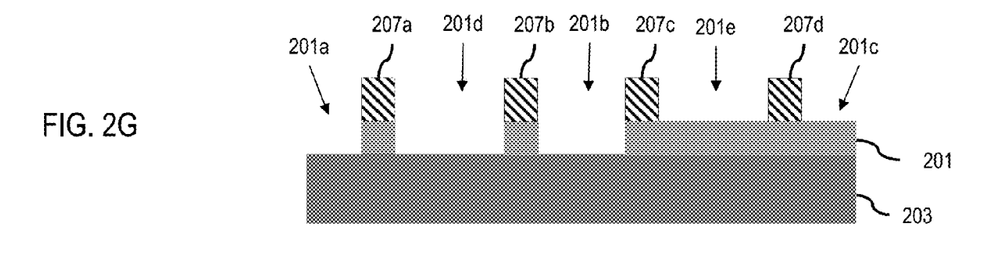

Referring to FIG. 2F, block-mask (e.g., photoresist) portions 209 may be formed over mandrel (e.g., 201e) and non-mandrel (e.g., 201c) spaces, over the upper surface of the hard-mask layer 201. In FIG. 2G, exposed sections of the hard-mask layer 201 in spaces 201a, 201b, and 201d are removed to expose sections of the upper surface of the silicon oxide layer 203 in the spaces 201a, 201b, and 201d. Also, the block-mask portions 209 are removed.

Figure 2H:
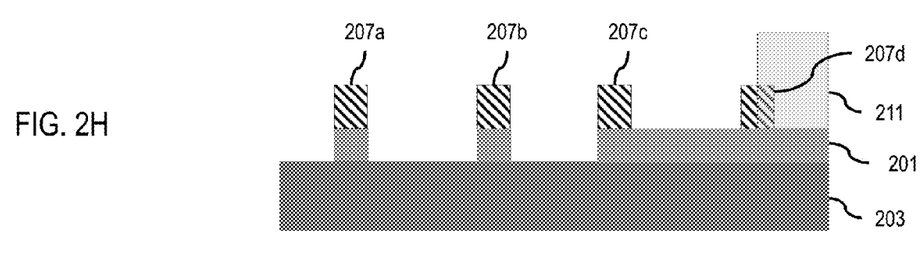
Figure 2I:
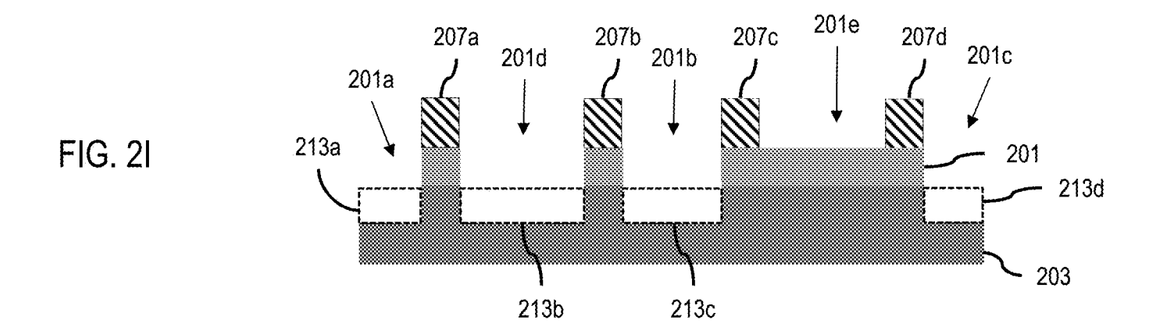
Figure 2J:
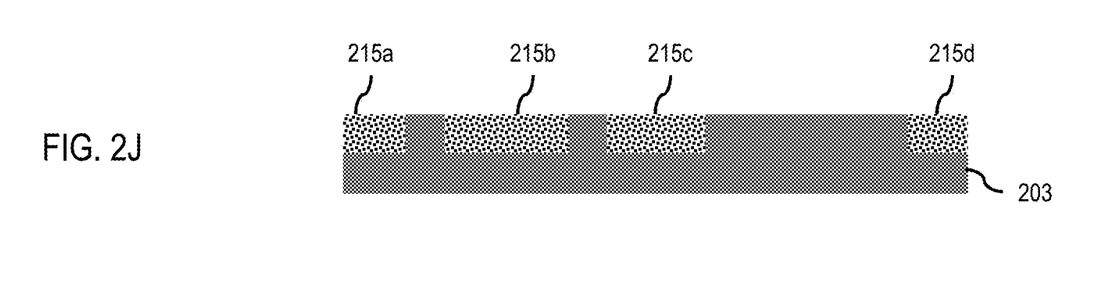

As illustrated in FIG. 2H, a cut-mask 211 is formed over the upper surface of the hard-mask layer 201 with openings shorter than the block-mask portions 209 in areas where the block-mask portions 209 had been previously formed (e.g., in space 201c). (Although shown as a block over space 201c for illustrative convenience, the cut-mask covers the whole substrate with the opening over space 201c.) FIG. 2I illustrates removing a section of the hard-mask layer 201 through the cut-mask 211 openings in space 201c. Next, the cut mask 211 is removed. Then, exposed sections of the silicon oxide layer 203 in spaces 201a, 201b, 201c, and 201d are removed/etched to form cavities 213a, 213b, 213c, and 213d in the silicon oxide layer 203. In FIG. 2J, the spacers 207a, 207b, 207c, and 207d as well as the remaining sections of the hard-mask layer 201 under said spacers and in the mandrel space 201e are removed. Next, a metal/conductive material (e.g., copper) layer is deposited in the cavities to form metal/conductive lines 215a, 215b, 215c, and 215d.

Figure 3A:
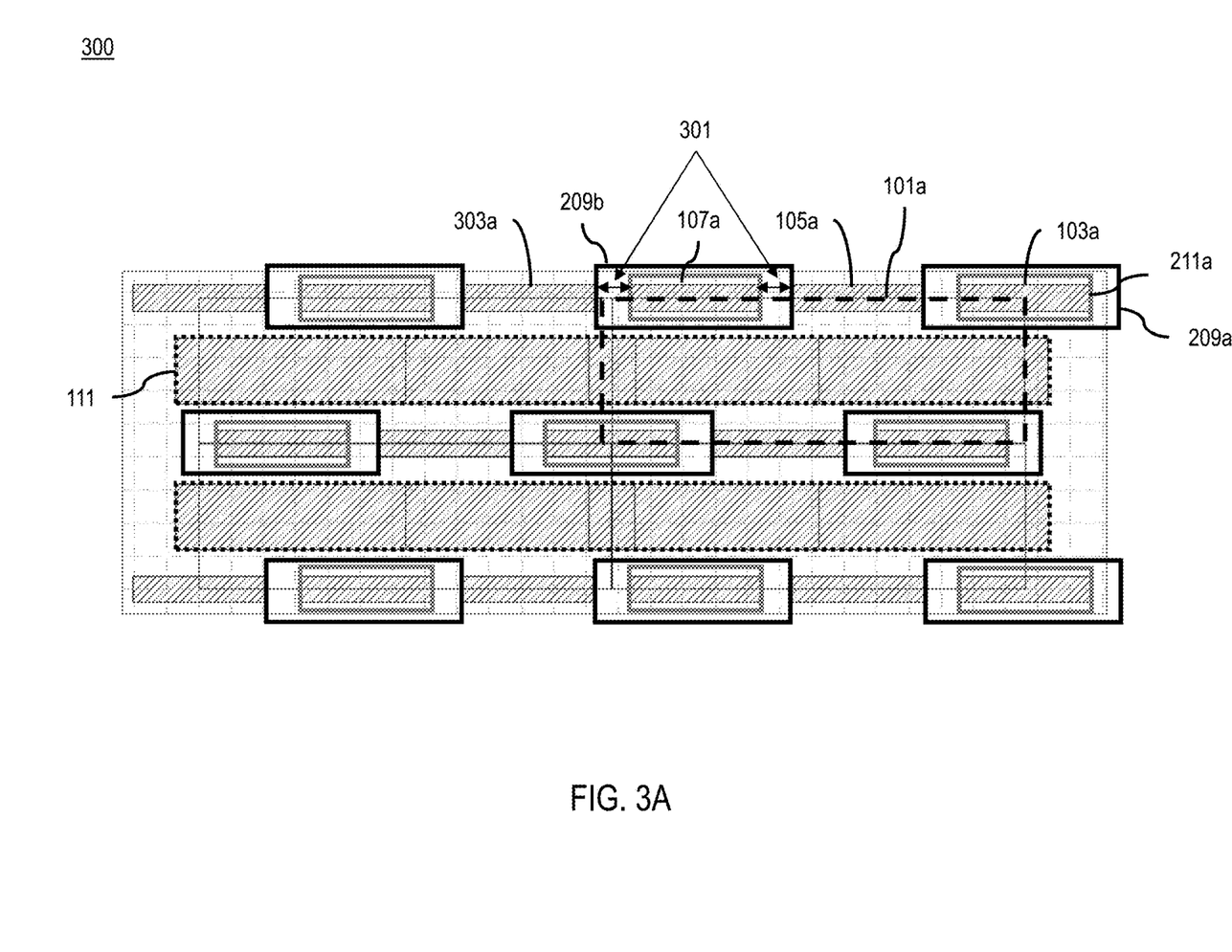
FIGS. 3A and 3B schematically the block mask and cut mask in illustrate layout diagrams of a metal layer in a memory cell formed by the process of FIGS. 2A through 2J.

FIG. 3A schematically illustrates a layout diagram of a metal layer in a memory (e.g., SRAM) cell 300, with block-mask portions and cut-mask openings which are utilized to create metal lines/segments. For example, to create the metal line 103a in the memory bitcell 101a, a block-mask portion 209a may be formed in a linear space over the hard mask layer as in FIG. 2F. Further, a cut-mask with an opening 211a may be formed within the same region as the block-mask portion 209a as in FIG. 2H. As illustrated, the block-mask portion 209a is wider and longer than the cut-mask opening 211a. The length of the cut-mask opening 211a equals the length of the metal line segment 103a. The length of a block-mask portion (e.g., 209b) may be equal to the length of a metal line 107a plus a width of spaces 301 between the metal line 107a and adjacent metal lines (e.g., 105a and 303a) on opposite sides of the metal line 107a. Additionally, adjacent block-mask portions (e.g., 209a and 209b) are arranged in a tip-to-tip layout formation. As noted earlier, a metal line formed in a mandrel space may be a word line such as WL2, 111.

Figures 3B, 3C:
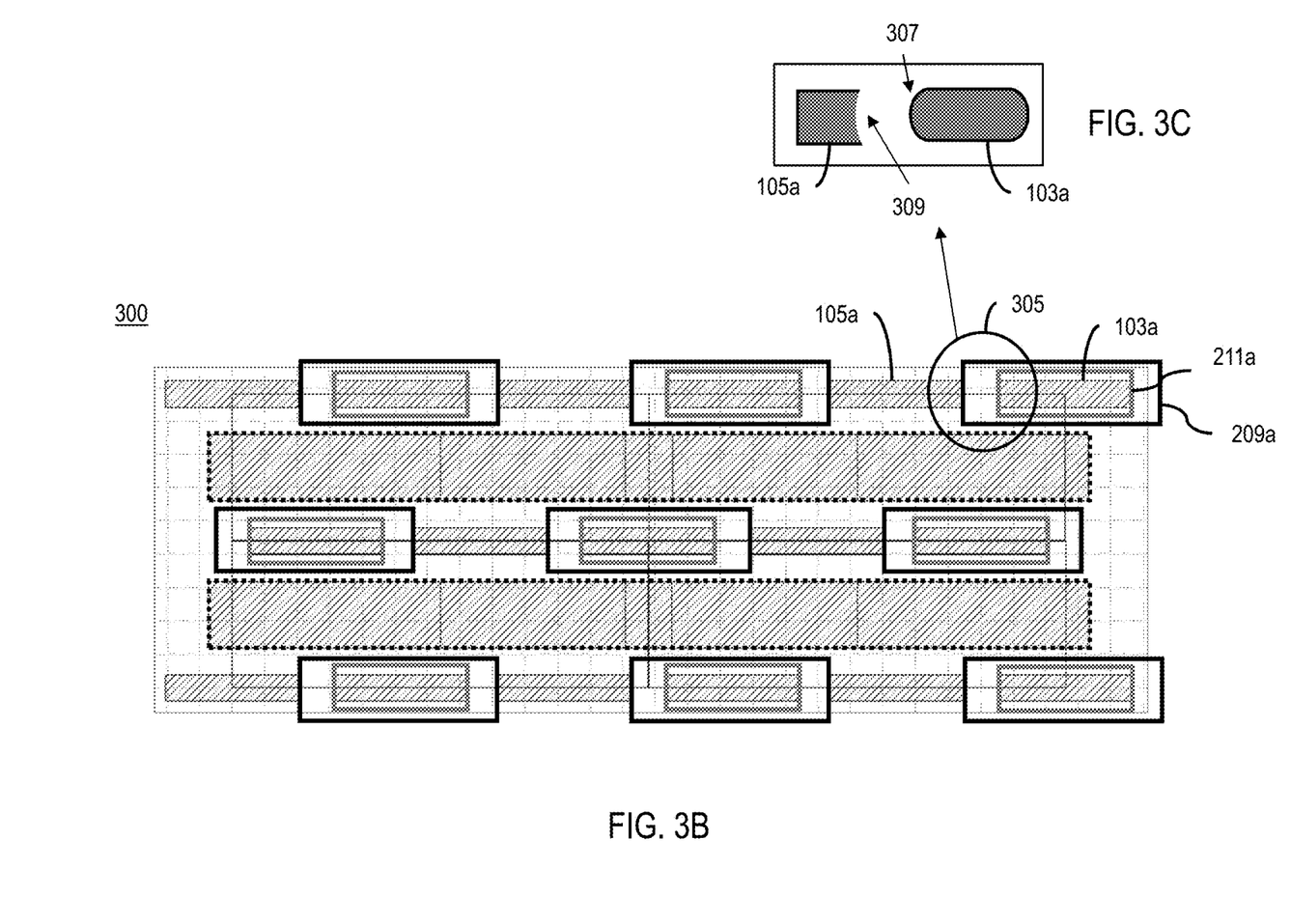
FIG. 3C illustrates tip-edge shapes of adjacent metal lines in the metal layer in the memory cell, in accordance with exemplary embodiments.

FIG. 3B illustrates the memory cell 300 where an example area 305 highlights tip-to-tip edges of the metal line segments 103a and 105a. FIG. 3C further highlights the area 305, which illustrates smooth convex and concave tip edges 307 and 309, respectively, of tip-to-tip edges of adjacent cavities that were previously formed in a silicon oxide layer and used to create the metal line segments 103a and 105a. It is noted that the convex and concave tip edges 307 and 309 have a smoother profile compared to the tip edges 127 illustrated in FIG. 1D.

The embodiments of the present disclosure can achieve several technical effects, such as eliminating the need for double exposure of block masks in an SADP process for forming metal lines and improving the electrical field in spaces between metal line tips. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices by way of a self-aligned double patterning process, particularly for the 10 and 7 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a hard-mask layer on an upper surface of a silicon oxide layer;
    forming spaced parallel mandrels on an upper surface of the hard-mask layer;
    forming spacers on opposite sides of each mandrel and removing the mandrels, forming alternating mandrel and non-mandrel spaces;
    forming block-mask portions over the mandrel and non-mandrel spaces, over the upper surface of the hard-mask layer;
    removing exposed sections of the hard-mask layer exposing sections of an upper surface of the silicon oxide layer, and removing the block-mask portions;
    forming a cut-mask with openings shorter than the block-mask portions over the upper surface of the hard-mask layer in areas where the block-mask portions had been;
    removing the hard-mask layer through the cut-mask openings, and removing the cut-mask;
    forming cavities in exposed regions of the silicon oxide layer;
    removing the spacers and any remaining hard-mask layer; and
    forming metal lines in the cavities.

2. The method of claim 1, wherein forming the spacers comprises:
    conformally forming a spacer material layer over the mandrels and the upper surface of the hard-mask layer; and
    removing the spacer material layer from all horizontal surfaces.

3. The method of claim 1, wherein the block-mask portions are wider and longer than the cut-mask openings.

4. The method of claim 1, wherein a length of each block-mask portion equals a length of a metal line plus a width of a space between the metal line and an adjacent metal line on each side of the metal line.

5. The method of claim 4, wherein a length of each cut-mask opening equals a length of a metal line.

6. The method of claim 1, wherein tip-to-tip edges of adjacent cavities in the silicon oxide layer include smooth concave and convex tip edges.

7. The method of claim 1, wherein the metal lines comprise a metal layer of a static random access memory device.

8. The method of claim 7, wherein metal lines formed in the mandrel spaces comprise word lines.

9. The method of claim 1, comprising forming adjacent block-mask portions in a tip-to-tip layout formation.

10. A method comprising:
    forming a hard-mask on an upper surface of a silicon oxide layer;
    forming a patterning template including a plurality of spaced parallel channels on an upper surface of the hard-mask, wherein the upper surface of the hard-mask is exposed between adjacent parallel channels;

forming block-mask portions over and extending in a same direction as a parallel channel, over the upper surface of the hard-mask layer;

removing exposed sections of the hard-mask layer exposing sections of an upper surface of the silicon oxide layer;

removing the block-mask portions and the patterning template;

forming a cut-mask with openings shorter than the block-mask portions over the upper surface of the hard-mask layer in areas where the block-mask portions had been;

removing the hard-mask layer through the cut-mask openings, and removing the cut-mask;

forming cavities in exposed regions of the silicon oxide layer; and forming metal lines in the cavities.

11. The method of claim 10, wherein forming the channels comprises:

forming spaced parallel dielectric lines on an upper surface of the hard-mask layer; and forming spacers on opposite sides of each of the dielectric lines and removing the dielectric lines, forming alternating dielectric and non-dielectric spaces.

12. The method of claim 10, wherein the block-mask portions are wider and longer than the cut-mask openings.

13. The method of claim 10, wherein a length of each block-mask portion equals a length of a metal line plus a width of a space between the metal line and an adjacent metal line on each side of the metal line.

14. The method of claim 13, wherein a length of each cut-mask opening equals a length of a metal line.

15. The method of claim 10, wherein tip-to-tip edges of adjacent cavities in the silicon oxide layer include smooth concave and convex tip edges.

16. The method of claim 10, wherein the metal lines comprise a metal layer of a static random access memory device.

17. The method of claim 11, wherein metal lines formed in dielectric spaces comprise word lines.

18. The method of claim 10, comprising forming adjacent block-mask portions in a tip-to-tip layout formation.

19. A method comprising:

forming a hard-mask layer on an upper surface of a silicon oxide layer;

forming spaced parallel mandrels on an upper surface of the hard-mask layer;

forming spacers on opposite sides of each mandrel and removing the mandrels, forming alternating mandrel and non-mandrel spaces;

forming block-mask portions over the mandrel and non-mandrel spaces, over the upper surface of the hard-mask layer, wherein adjacent block-mask portions are in a tip-to-tip layout formation;

removing exposed sections of the hard-mask layer exposing sections of an upper surface of the silicon oxide layer, and removing the block-mask portions;

forming a cut-mask with openings shorter than the block-mask portions over the upper surface of the hard-mask layer in areas where the block-mask portions had been, wherein the block-mask portions are wider and longer than the cut-mask openings;

removing the hard-mask layer through the cut-mask openings, and removing the cut-mask;

forming cavities in exposed regions of the silicon oxide layer, wherein tip-to-tip edges of adjacent cavities in the silicon oxide layer include smooth concave and convex tip edges;

removing the spacers and any remaining hard-mask layer; and forming metal lines in the cavities, wherein the metal lines comprise a metal layer of a static random access memory device.

20. The method of claim 19, wherein a length of each block-mask portion equals a length of a metal line plus a width of a space between the metal line and an adjacent metal line on each side of the metal line, and wherein a length of each cut-mask opening equals a length of a metal line.

* * * * *